United States Patent [19]
Ogden et al.

[11] Patent Number: 5,621,363
[45] Date of Patent: Apr. 15, 1997

[54] MODEM HAVING AN ELECTROMAGNETIC SHIELD FOR A CONTROLLER

[75] Inventors: Allen L. Ogden, Richmond; Joseph F. D. Beaudoin, Surrey; Tateshi Yamada, Richmond, all of Canada

[73] Assignee: Motorola, Inc., Schaumburg, Ill.

[21] Appl. No.: 317,085

[22] Filed: Oct. 3, 1994

[51] Int. Cl.⁶ .................................................. H05K 9/00
[52] U.S. Cl. .................... 333/12; 333/182; 361/818; 455/89; 455/90; 174/35 R; 439/620; 375/222; 379/98
[58] Field of Search ................ 333/12, 167, 182, 333/183, 184, 185; 174/35 R, 35 C, 35 GC, 51; 361/753, 816, 818; 455/89, 90; 439/620; 375/222; 379/98

[56] References Cited

U.S. PATENT DOCUMENTS

| | | | |
|---|---|---|---|
| 5,010,322 | 4/1991 | Fry et al. | 174/35 R X |
| 5,036,301 | 7/1991 | Takao et al. | 333/185 |
| 5,089,794 | 2/1992 | Norimatsu | 361/816 |
| 5,165,055 | 11/1992 | Metsler | 333/12 |
| 5,202,815 | 4/1993 | Le Boennec et al. | 174/35 R X |
| 5,373,149 | 12/1994 | Rasmussen | 235/487 X |
| 5,397,857 | 3/1995 | Farquhar et al. | 361/753 X |
| 5,400,949 | 3/1995 | Hirvonen et al. | 361/818 X |
| 5,440,448 | 8/1995 | Stewart et al. | 361/753 X |
| 5,510,778 | 4/1996 | Krieter et al. | 340/825.44 |

FOREIGN PATENT DOCUMENTS

| | | | |
|---|---|---|---|
| 429037 | 5/1991 | European Pat. Off. | 361/818 |
| 3195092 | 8/1991 | Japan | 361/818 |

*Primary Examiner*—Benny T. Lee
*Assistant Examiner*—Justin P. Bettendorf
*Attorney, Agent, or Firm*—Kevin A. Buford

[57] ABSTRACT

An electromagnetic shield providing for input/output signal paths includes: a carrier 101 having a shielding surface 103 that has electromagnetic shielding properties; a plurality of signal paths 107 mechanically coupled to the carrier 101; a plurality of filtering elements 109 corresponding to the plurality of signal paths 107 and electrically coupled, respectively, from the plurality of signal paths 107 to the shielding surface 103; and an enclosure 101 constructed from a material having electromagnetic shielding properties and having a perimeter edge 113 that is arranged and constructed to electrically couple the enclosure 111 to the shielding surface 103 at an interface so as to sandwich the plurality of filtering elements 109 between the perimeter edge 113 and the shielding surface 103 at the interface such that the plurality of signal paths 107 pass through the interface.

15 Claims, 2 Drawing Sheets

MODEM HAVING AN ELECTROMAGNETIC SHIELD FOR A CONTROLLER

FIELD OF THE INVENTION

Generally the instant disclosure concerns an electromagnetic energy shield and more particularly but not limited to such a shield for digital controllers.

BACKGROUND OF THE INVENTION

Electromagnetic shields are known. The electromagnetic noise generated by and emanating from digital controllers is known and has become more severe as the operating speed and relative complexity in terms of the requisite number of signal paths for such controllers continues to increase. The importance of such shields and shielding systems along with the severity of the effects of the electromagnetic noise have increased with the relative reduction in the physical size of underlying electronic assemblies. The advent of reduced size automated surface mount assembly technology has forced the electromagnetic shield to occupy a minimum amount of physical space while providing superb shielding, be assembly efficient, and of course economically effective.

Reduced size goals for the assembly mandates minimizing the size of all components and the space between components and subassemblies as well as minimizing part counts. As a result of these space reductions the degree of shielding required may have increased since circuits, such as digital controllers and receivers, that historically did not need to be especially well isolated may now have to be in order to operate satisfactorily. This has mandated that practitioners direct significant attention to increasing the effectiveness of while simultaneously reducing the effective size of such shields. Assembly efficiency ordinarily mandates minimal part counts with 1 component being favored over 2 components, etc. In addition automated assembly requires a regular shaped component that is easily and repetitively handled by mechanically actuated assembly arms and this favors relatively regular exterior surfaces with a minimal amount of assembly motion directed to orientation.

It is known to use electromagnetic shields that resemble an open sided box with the open side being placed on a carrier, however these shields may not provide sufficient shielding effectiveness, particularly when numerous signal paths must traverse the shield boundaries. This signal path problem may be resolved by using feed through capacitors electrically coupled to the sides of the box and providing connections to both terminals of the capacitor. However this is expensive, both in terms of the capacitors as well as the connections to both terminals of the capacitor plus normally proves to be prohibitively expensive and unwieldy to assemble.

Clearly a need exists for a cost effective electromagnetic shield for digital controllers that provides sufficient shielding effectiveness at a practical size and cost and consistent with the requirements of reduced size automated surface mount assembly operations.

BRIEF DESCRIPTION OF THE DRAWINGS

The features of the present invention which are believed to be novel are set, forth with particularity in the appended claims. However, the invention together with further advantages thereof, may best be understood by reference to the accompanying drawings wherein:

DETAILED DESCRIPTION OF A PREFERRED EMBODIMENT

Generally the present disclosure concerns a shielding system that includes an electromagnetic shield that is particularly adapted to facilitate an electromagnetically shielded controller. More particularly an electromagnetic shield providing for input/output signal paths is disclosed. The shield includes in combination: a carrier having a shielding surface, the shielding surface having electromagnetic shielding properties; a plurality of signal paths mechanically coupled to the carrier; a plurality of filtering elements corresponding to the plurality of signal paths and electrically coupled, respectively, from the plurality of signal paths to the shielding surface; and an enclosure constructed from a material having electromagnetic shielding properties and having a perimeter edge that is arranged and constructed to electrically couple the enclosure to the shielding surface at an interface so as to sandwich the plurality of filtering elements between the perimeter edge and the shielding surface at the interface such that the plurality of signal paths pass through the interface.

Further disclosed is an electromagnetically shielded controller that includes in combination: a carrier having a shielding surface with electromagnetic shielding properties and an interconnect surface; a controller for providing general purpose control of a peripheral function, the controller receiving and providing signals, respectively, from and to the peripheral over a plurality of signal paths, the controller electrically coupled to and interconnected by the interconnect surface; a plurality of filtering elements corresponding to the plurality of signal paths, the plurality of filtering elements electrically coupled, respectively, from the plurality of signal paths to the shielding surface; and an enclosure constructed from a material having electromagnetic shielding properties and having a perimeter edge that is arranged and constructed to electrically couple the enclosure to the shielding surface at an interface so as to sandwich the plurality of filtering elements between the perimeter edge and the shielding surface at the interface such that the plurality of signal paths pass through the interface.

Figure 1:
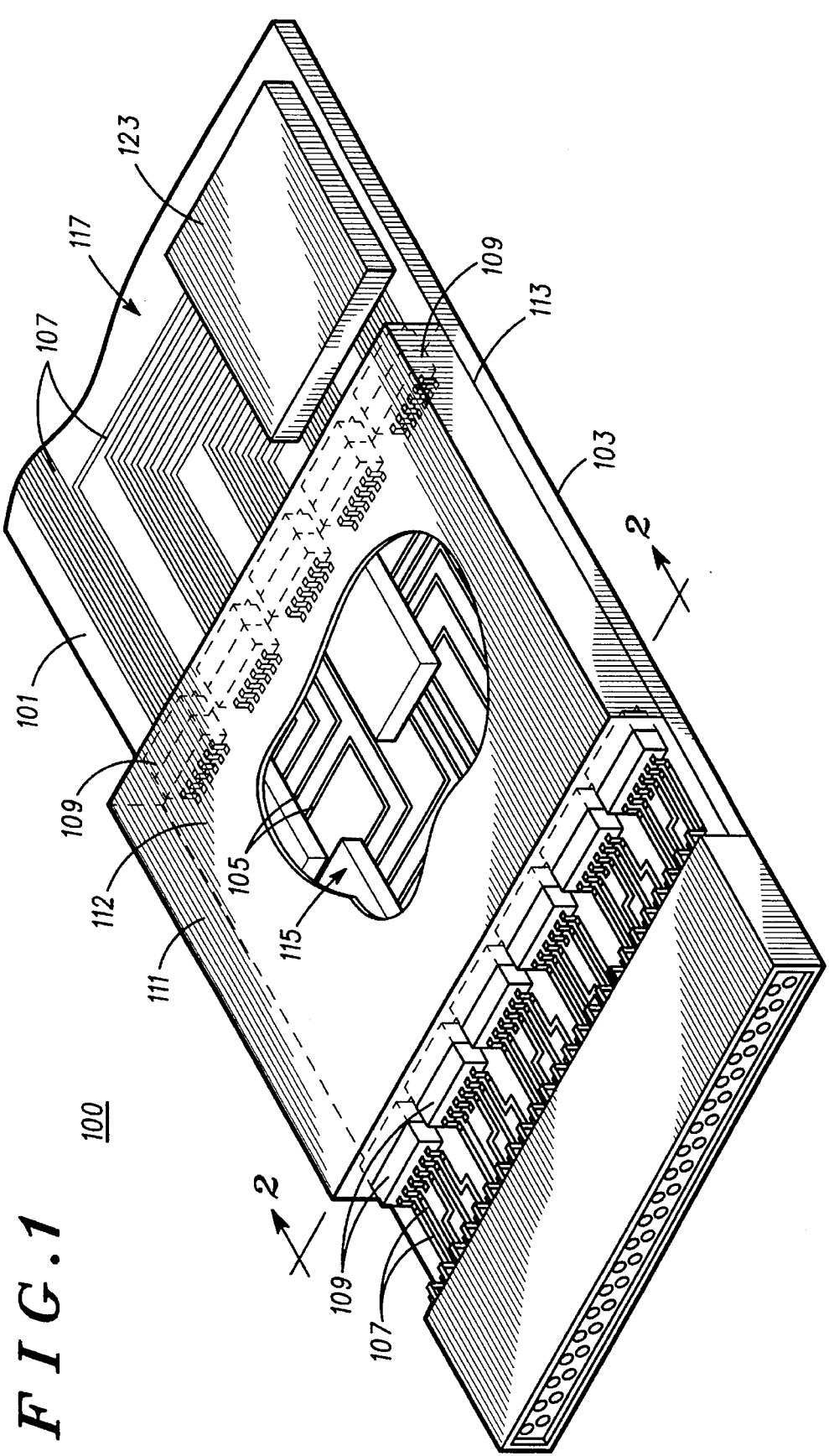
FIG. 1 is a rotational diagram of an electromagnetically shielded controller in accordance with the instant invention.
Figure 2:
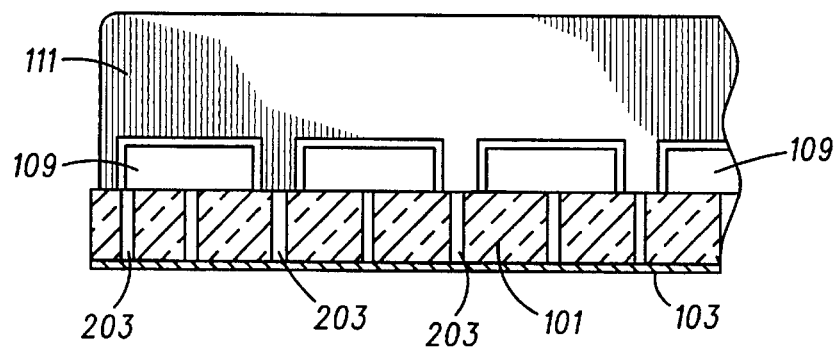
FIG. 2 is a cross sectional diagram of a portion of the electromagnetic shield depicted in FIG. 1 and having like-numbered elements.

Referring to the figures, FIG. 1 is a rotational diagram or view and FIG. 2 is a cross section view in part (along the plane A–A' of FIG. 1) of an electromagnetically shielded controller 100 arranged and constructed in accordance with a preferred embodiment of the instant invention. FIG. 1 depicts a carrier 101, such as a printed circuit board, that has a shielding surface 103 and an interconnect surface 105, a plurality of signal paths 107 coupled to a plurality of filtering elements 109, an enclosure 111 having a perimeter edge 113, a controller 115, a peripheral 117, such as a radio modem 123, and a Personal Computer Memory Card International Association (PCMCIA) connector 121.

As an overview, various input output signals from, for example, a host computer (not specifically shown) are coupled by way of the PCMCIA connector 121 to the controller 115 within the enclosure 111 via the plurality of signal paths 107 and the plurality of filtering elements 109. Similarly various input output signals from the controller 115 are coupled to the peripheral 117 by way of the plurality of filtering elements 109 and the plurality of signal paths 107. In this fashion it has been experimentally shown that adverse effects of electromagnetic energy generated by the controller can be minimized by constraining such energy to the internal surfaces of an electromagnetic shield with boundaries defined by the enclosure 111 as electrically coupled to the shielding surface 103 at an interface at and along the perimeter edge 113. Thus an electromagnetically shielded controller for providing general purpose control of the peripheral 117 may be constructed.

The carrier 101, preferably, is a multi-layer printed circuit board that serves as a mechanical skeleton and electrical interconnection system for the controller 115 and the peripheral 117, here a radio modem 123. The shielding surface 103 has electromagnetic shielding properties such as would be provided by a conductive layer, such as a layer of 1 ounce copper, preferably disposed and mechanically coupled to the carrier on a first or lower surface of the carrier 101. Care has been taken to avoid any openings in this shielding surface 103 with dimensions in excess of one thousandth the wavelength of the electromagnetic energy that should be attenuated, more specifically 0.3 millimeters. Additionally vias 203, shown in representative fashion in FIG. 2, have been included and spaced on a semi-regular basis at a dimension of 2.54 millimeters, to extend and connect the shielding surface 103 to a second or upper surface of the carrier 101. The vias 203 have been arranged so as to match or correspond to the perimeter edge 113 of the enclosure 111 along the interface.

The interconnect surface 105 of FIG. 1 is preferably the remaining portion of a second conductive layer, such as a layer of 1 ounce copper, preferably disposed on the second or upper surface of and mechanically coupled to the carrier 101. The interconnect surface 105 has been arranged as is well known to electrically connect various points, terminals, or leads from one to another component within the controller, as depicted generally in the FIG. 3 schematic.

Figure 3:
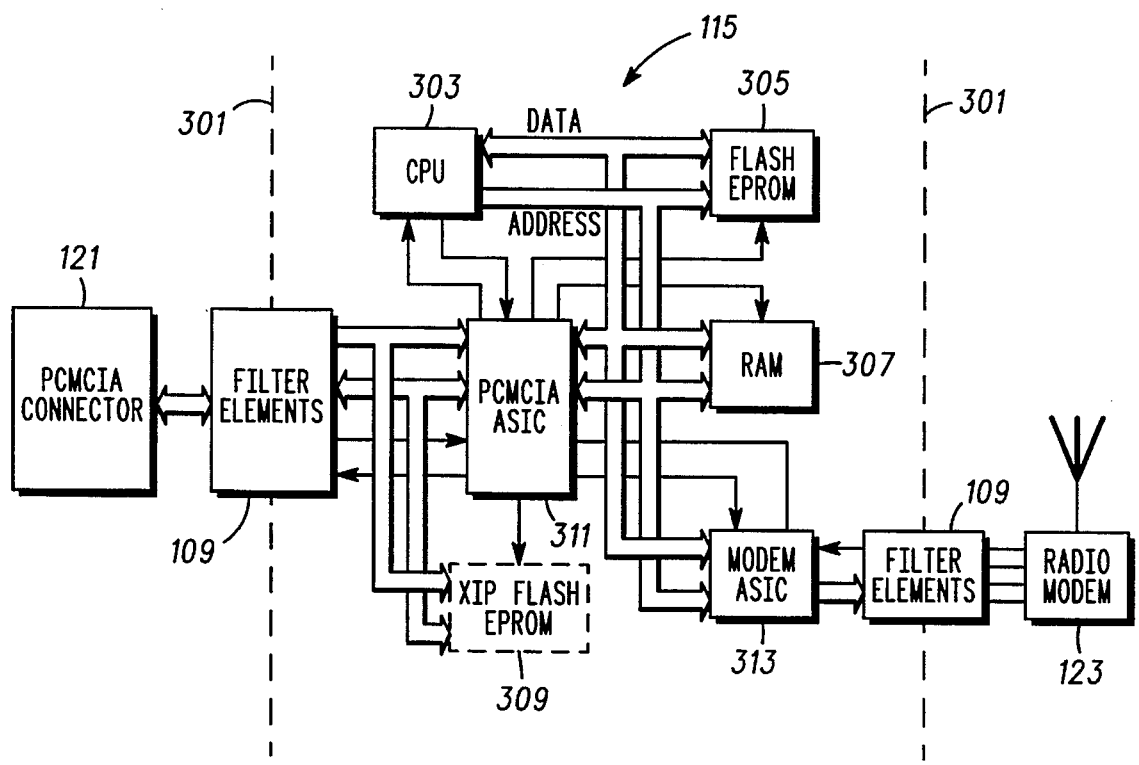
FIG. 3 is a block diagram of a preferred embodiment of the electromagnetically shielded controller depicted in FIG. 1.

The controller 115 is arranged, configured, and constructed for providing general purpose control of a peripheral function, such as the radio modem 123, in addition to interfacing the peripheral function to such other entities as a host computer. The controller 115 receives and provides or furnishes signals, respectively, from and to said peripheral over the plurality, or portion thereof, of signal paths 107. The controller 115, more specifically various components included therein as depicted in FIG. 3, is electrically coupled to and interconnected by the interconnect surface 105.

The plurality of filtering elements 109, one each corresponding to one each of the plurality of signal paths, are electrically coupled, respectively, from each of the plurality of signal paths to the shielding surface. In the preferred embodiment the filtering elements are capacitive feed through components each of which is a three terminal surface mountable feed through capacitor. The three terminals include a first and second terminal associated with either end of a signal path while a third terminal is one terminal of a capacitor that is coupled to the signal path. In the preferred embodiment the capacitive feed through Components are included six (6) up in an array or capacitor array 109. Such arrays are available from various suppliers, such as Murata in a surface mount configuration using an NFA series part designation. The NFA series arrays come in various capacitance values from 22 picofarads to 100,000 picofarads at various current ratings, etc. Generally a capacitance value should be maintained as small as possible while still providing the desired degree of filtering. In the preferred embodiment values of 47, 100, and 220 picofarads were experimentally determined to provide satisfactory results.

In application the plurality of filtering elements 109 have been physically positioned such that the body of the element, specifically the array, occupies or in some sense is bisected by the interface between the enclosure 111 and the shielding surface 103 while the signal paths within the array transcend, intersect, or pass through the interface. The array 109 has a common capacitor terminal for all six of the capacitors within the array and this common capacitor terminal is electrically coupled to the shielding surface 103 at or near the interface. Each of the filtering elements is arranged such that the first terminal is external to the enclosure 111 and the second terminal is internal to the enclosure 111 while the third terminal, associated with the capacitor, is electrically coupled to the shielding surface 103 at or near the interface.

The enclosure 111 is constructed via a stamping and forming operation from a material, such as pre tinned half hard 0.2 millimeter (mm) thick copper, that has electromagnetic shielding properties to, preferably resemble an open sided box like structure. This open sided box like structure, specifically the enclosure 111, is a surface mountable component. The material, preferably, is perforated on a first side 112 with small, relative to the wavelength of undesirable electromagnetic energy, 2.0 mm diameter openings so as to provide for post assembly visual inspection of the components included with the controller 115 inside the enclosure 111. The perimeter edge 113 is arranged and constructed to electrically and mechanically couple, using a reflow soldering process, the enclosure 111 to the shielding surface 113 at the interface. Along the perimeter edge 113 in the areas that bisect or interface with the plurality of filtering elements 109 the perimeter edge 113 includes projections 135 that are approximately 0.9 mm in width by 1.2 mm in length. When assembled these projections 135 are reflow soldered to the shielding surface as extended by the vias 203 of FIG. 2 and to the common capacitor terminals of the adjacent capacitor arrays 109. In the finished assembly the enclosure may be said to sandwich the plurality of filtering elements between the perimeter edge 113 and the shielding surface 103 at the interface such that the plurality of signal paths pass through the interface.

Referring to the FIG. 3 block diagram, an electromagnetically shielded controller is depicted with like reference numerals referring to like elements from FIG. 1. Specifically the controller 115 is shown bounded by the dashed lines 301 whose location is intended to signify that the filter elements 109 are partially within and partially without the electromagnetic shield formed by the enclosure 111, et al. The controller 115 includes a microprocessor 303, such as a Motorola MC68330, a Flash electrically programmable read only memory (EPROM) 305, a random access memory (RAM) 307, an execute in Place (XIP) flash EPROM 309, a PCMCIA application specific integrated circuit (ASIC) 311, and a modem ASIC 313 all interconnected in known fashion, as depicted, by a data bus, an address bus, and various control signals. The ASICs 311 and 313 have been designed to consolidate a number of discrete or limited function components with minimum physical size as an objective. The PCMCIA ASIC 311 operates to facilitate a controller to PCMCIA port type of interface as defined by the PCMCIA standard. The modem ASIC 313 facilitates the various control and communications functions including some data encoding and decoding activities that are required to interface the controller 115 to the radio modem 123.

It will be appreciated by those of ordinary skill in the art that the apparatus disclosed provides a cost effective electromagnetic shield that is particularly advantageous for providing sufficient shielding effectiveness for controllers and that otherwise lends itself to reduced size automated surface mount assembly operations all at a practical size and cost.

This inventive electromagnetic shield and shielding system may be readily and advantageously employed in automated surface mount assembly operations, without otherwise sacrificing shielding effectiveness, component count or size, or other economic considerations. Hence, the present invention, in furtherance of satisfying a long-felt and growing need in the field facilitates an electromagnetic shield having improved shielding effectiveness along with the other attributes known to be desirable in state of the art assembly operations.

It will be apparent to those skilled in the art that the disclosed invention may be modified in numerous ways and may assume many embodiments other than the preferred form specifically set out and described above. For example while one embodiment of the enclosure and filtering element has been discussed others of greater geometric complexity or different circuit topology clearly exist. Accordingly, it is intended by the appended claims to cover all modifications of the invention which fall within the true spirit and scope of the invention.

What is claimed is:

1. An electromagnetic shield providing for input/output signal paths, the shield comprising in combination:

a carrier having a shielding surface and an opposite interconnect surface, said shielding surface having electromagnetic shielding properties;

a plurality of signal paths coupled to said interconnect surface of said carrier;

a plurality of filtering elements corresponding to said plurality of signal paths, said plurality of filtering elements electrically coupled, respectively, from said plurality of signal paths to said shielding surface;

an enclosure mounted on said interconnect surface and constructed from a material having electromagnetic shielding properties and having a perimeter edge, said perimeter edge arranged and constructed to sandwich said plurality of filtering elements between said perimeter edge and said interconnect surface by comprising projections extending to said interconnect surface between adjacent filtering elements; and a plurality of vias extending through said carrier at positions corresponding to said projections, electrically coupling said projections to said shielding surface and thereby electrically coupling said enclosure to said shielding surface.

2. The electromagnetic shield of claim 1 wherein said filtering elements are surface mountable feed through capacitors.

3. The electromagnetic shield of claim 2 wherein said surface mountable feed through capacitors are provided in arrays of such capacitors.

4. The electromagnetic shield of claim 1 wherein said enclosure is a surface mountable component that is reflow soldered to said conductive vias.

5. An electromagnetically shielded controller comprising in combination:

a carrier having a shielding surface and an interconnect surface and a plurality of conductive vias extending therebetween, said shielding surface having electromagnetic shielding properties;

a controller for providing general purpose control of a peripheral function, said controller receiving and providing signals, respectively, from and to said peripheral over a plurality of signal paths, said controller electrically coupled to and interconnected by said interconnect surface;

a plurality of filtering elements corresponding to said plurality of signal paths, said plurality of filtering elements electrically coupled, respectively, from and to said plurality of signal paths and through said vias to said shielding surface; and an enclosure mounted on said interconnect surface and constructed from a material having electromagnetic shielding properties and having a perimeter edge, said perimeter edge arranged and constructed to electrically couple said enclosure to said shielding surface via said conductive vias and to sandwich said plurality of filtering elements between said perimeter edge and said interconnect surface, wherein the enclosure comprises projections extending to said interconnect surface between adjacent filtering elements and said vias extend through said carrier at positions corresponding to said projections, electrically coupling said projections to said shielding surface.

6. The electromagnetically shielded controller of claim 5 wherein said filtering elements are surface mountable feed through capacitors.

7. The electromagnetically shielded controller of claim 6 wherein said surface mountable feed through capacitors are provided in arrays of such capacitors.

8. The electromagnetically shielded controller of claim 5 wherein said enclosure is a surface mountable component that is reflow soldered to said shielded surface.

9. A modem having electromagnetically shielded circuitry, comprising:

a carrier having a shielding surface and an interconnect surface;

a controller mounted on said interconnect surface;

at least one signal path on said interconnect surface coupled to said controller, said signal path comprising a filter element mounted on said interconnect surface, said filter element also being coupled to said shielding surface; and an enclosure having electromagnetic shielding properties mounted on said interconnect surface along a perimeter edge so as to enclose said controller, said perimeter edge of said enclosure arranged so as to sandwich said plurality of filtering elements between a first portion of said perimeter edge and said interconnect surface and to couple said enclosure to said shielding surface via conductive vias, said enclosure comprising projections extending to said interconnect surface between adjacent filtering elements and said vias extending through said carrier at positions corresponding to said projections.

10. The modem of claim 9, wherein said carrier is a printed circuit board.

11. The modem of claim 10, wherein said shielding surface is a conductive layer on a first side of said printed circuit board.

12. The modem of claim 9, wherein said controller comprises a microprocessor.

13. The modem of claim 9, wherein said controller comprises a PCMCIA application specific integrated circuit.

14. The modem of claim 9, wherein said filter element comprises a surface mountable three terminal capacitor having a first terminal external to said enclosure, a second terminal enclosed by said enclosure, and a common terminal coupled to said shielding surface.

15. The modem of claim 14, wherein said common terminal is coupled by a further via in said carrier to said shielding surface.

* * * * *